(12) United States Patent
Lowe et al.

(10) Patent No.: US 6,937,172 B1
(45) Date of Patent: Aug. 30, 2005

(54) METHOD AND SYSTEM FOR GRAY-CODING COUNTING

(75) Inventors: Wayson J. Lowe, Belmont, CA (US); Eunice Y. D. Hao, Saratoga, CA (US); Tony K. Ngai, Saratoga, CA (US); Peter H. Alfke, Los Altos Hills, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/838,965

(22) Filed: May 4, 2004

(51) Int. Cl.$^7$ .............................................. H03M 7/04
(52) U.S. Cl. ......................................... 341/97; 341/98
(58) Field of Search ...................... 341/98, 97; 377/26, 377/34, 108

(56) References Cited

U.S. PATENT DOCUMENTS

| | | | |
|---|---|---|---|
| 4,119,961 A * | 10/1978 | Rockett, Jr. .................. | 341/98 |
| 4,942,553 A | 7/1990 | Dalrymple et al. | |
| 5,426,756 A * | 6/1995 | Shyi et al. .................. | 711/159 |
| 5,754,614 A * | 5/1998 | Wingen ........................ | 377/34 |
| 5,898,893 A | 4/1999 | Alfke | |
| 6,041,370 A | 3/2000 | Guyt | |
| 6,308,249 B1 | 10/2001 | Okazawa | |
| 6,314,154 B1 * | 11/2001 | Pontius ........................ | 377/16 |
| 6,337,893 B1 * | 1/2002 | Pontius ........................ | 377/108 |
| 6,366,530 B1 | 4/2002 | Sluiter et al. | |
| 6,389,490 B1 | 5/2002 | Camilleri et al. | |
| 6,401,148 B1 | 6/2002 | Camilleri | |
| 6,405,269 B1 | 6/2002 | Camilleri et al. | |
| 6,434,642 B1 | 8/2002 | Camilleri et al. | |
| 6,801,143 B2 * | 10/2004 | Oberai et al. .................. | 341/98 |

OTHER PUBLICATIONS

Clifford E. Cummings and Peter Alfke; "Simulation and Synthesis Techniques for Asynchronous FIFO Design with Asynchronous Pointer Comparisons"; Re 1.1;SNUG San Jose 2002; pp. 1-18.
Xilinx, Inc.; "170 MHz FIFOs Using the Virtex Block SelectRam+ Feature"; XAPP131 (v 1.7); Mar. 26, 2003; available from Xilinx, 2100 Logic Drive, San Jose, Califonia 95124; pp. 1-7.
Xilinx, Inc.; "Synchronous and Asynchronous FIFO Designs"; XAPP 051 (Version 2.0); Sep. 17, 1996; available from Xilinx, 2100 Logic Drive, San Jose, California 95124; pp. 1-12.
U.S. Appl. No. 10/838,957, filed May 4, 2004, Lowe et al.
U.S. Appl. No. 10/839,201, filed May 4, 2004, Lowe et al.
U.S. Appl. No. 10/839,402, filed May 4, 2004, Lowe et al.
Xilinx, Inc.; "Asynchronous FIFO in Virtex-II FPGAs"; TechXclusives; downloaded Apr. 12, 2004 from http://support.xilinx.com/xlnx/xweb/sil_tx_printfriendly. jsp?BV_SessionID=@@@@116 . . . ; pp. 1-3.

* cited by examiner

Primary Examiner—Michael Tokar
Assistant Examiner—Linh Van Nguyen
(74) Attorney, Agent, or Firm—Scott Hewett; Kim Kanzaki

(57) ABSTRACT

A system for gray-code counting in an integrated circuit such as a programmable logic device uses a binary adder coupled to a binary counter output and to a selected binary offset value. The binary adder provides a binary sum that is converted to a gray code value by a binary-to-gray converter. The gray code value represents the binary sum output.

12 Claims, 13 Drawing Sheets

METHOD AND SYSTEM FOR GRAY-CODING COUNTING

FIELD OF THE INVENTION

This invention relates generally to digital logic devices, and more particularly to devices and methods for configuring random access memory ("RAM") to function as a first-in, first-out ("FIFO") memory system.

BACKGROUND OF THE INVENTION

FIFO memory systems are used in a wide variety of applications, such as buffering high-speed serial data immediately after it has been parallelized, for temporary storage of a data packet during packet processing, or buffering data going to or coming from a disk. Data values that are sequentially written to a FIFO buffer are read from the FIFO buffer in the same order, namely the first data entered into the FIFO memory system is the first data read from the FIFO memory system.

FIFO buffers are implemented in RAM and the flow of data into and out of RAM is controlled by address counters that track the read and write addresses being used. The address counters coordinate the data flow into and out of RAM to insure that memory is available to accept incoming data to prevent overflowing the RAM, and that data is stored in RAM before a read operation executes.

FIFO memory systems generate status flags, such as FIFO FULL and FIFO EMPTY, which indicate the RAM is full or empty. In other words, these flags indicate whether or not there is sufficient space in RAM for a WRITE to occur or a READ to be performed. The FIFO FULL status flag is used to prevent a WRITE operation to a full FIFO memory buffer. The FIFO EMPTY status flag is used to prevent a READ operation from an empty FIFO memory buffer.

FIFO memory systems can be synchronous or asynchronous. A FIFO memory system in which both the read address counter and the write address counter are clocked by the same clock signal is referred to as a synchronous FIFO memory system. A FIFO memory system in which the read address counter and the write address counter are clocked by different clock signals is referred to as an asynchronous FIFO memory system. Asynchronous FIFO memory systems are extremely useful in digital data systems where different sides of the FIFO memory system are independently clocked, either at different clock rates, or at the same clock rate, but with an unknown phase difference ("skew").

In both synchronous and asynchronous FIFO systems, the read and write address counters are circular counters that wrap around to an initial address after the last address is accessed. The read and write address counter output signals are either multiplexed to address a single-port random access memory (RAM), or they are separately provided to address different input ports of a multi-port RAM (e.g. a dual-port RAM).

FIFO memory systems have been configured in programmable logic devices ("PLDs"), such as a field-programmable gate arrays ("FPGAs") and complex programmable logic devices ("CPLDs"). PLDs are semiconductor integrated circuits that have a "fabric" of programmable logic, and other functional portions, such as RAM.

FIFO memory systems have been implemented in PLDs using the fabric of the PLD to provide the FIFO control logic, such as generating the status flags, and providing the write and read addresses of FIFO memory systems. Such FIFO memory systems are described in co-owned U.S. Pat. Nos. 5,898,893 and 6,434,642. These patents are hereby incorporated by reference in their entirety for all purposes. The logic for operating the FIFO memory system is typically developed in configurable logic blocks ("CLBs") surrounding an embedded block of RAM ("BRAM"), and the embedded BRAM is operated as a FIFO buffer. In alternative designs, distributed memory is used in a FIFO memory system. However, in either instance it is often desirable to have CLBs available to perform other logic functions. Additional information regarding configuring FIFO memory systems in FPGAs is available in Application Note XAPP131, available from XILINX, INC., of San Jose, Calif.

Programming CLBs to provide the logic functions of a FIFO memory system can be challenging in certain applications, particularly generating status flags in asynchronous applications. Therefore, there is a need for an improved FIFO memory system.

SUMMARY OF THE INVENTION

A system for gray-code counting in an integrated circuit (IC) uses a binary adder coupled to a binary counter output and to a selected binary offset value. The binary adder provides a binary sum that is converted to a gray code value by a binary-to-gray converter. The gray code value represents the binary sum output. The IC may further include a programmable logic device (PLD).

DETAILED DESCRIPTION OF THE DRAWINGS

I. An IC with an Embedded FIFO Memory System

Embodiments of the present invention include hardwired FIFO circuitry embedded in an integrated circuit (IC). In an exemplary embodiment the IC further includes a programmable function circuit coupled to the embedded FIFO, where the programmable function circuit may a configurable logic block (CLB), a programmable multi-gigabit transceiver (MGT) or other circuitry having a programmable function.

In the exemplary embodiment, the FIFO further includes full, empty, substantially full, and substantially empty indications. For purposes of ease of illustration and in one example, the buffer addressing, for example BRAM addressing, for the FIFO data is circular, the read pointer (rptr) and write pointer (wptr) are initialized to the same buffer position, and the rptr or wprt are incremented when there is a read or write, respectively, to the FIFO. Further, the substantially full and substantially empty indications are illustrated by almost full and almost empty status flags.

As known to one of ordinary skill in the art the circular buffer may be conceptual and an actual implementation may include a FIFO buffer having a fixed length, e.g., M storage elements, where M is a positive number, so that the buffer entries go from 0 to (M−1). The read pointer and write pointer are modulo M, so that the pointers wrap around. In another embodiment the pointers may be decremented rather than incremented and in a further embodiment the increment/decrement interval may be any integer value.

To continue with the illustrative example, the reads and writes happen asynchronously, hence the rptr and the wptr are incremented independently. Initially the rptr is set (or reset) to be equal to the wptr and this indicates an empty state for the FIFO. Assuming no reads and only writes, the wptr will reach an almost full state when it is at or within a write pointer offset distance of the rptr. The writes can continue, until the wptr equals the rptr, and the FIFO is in the full state. If there is a further write, a write error will be indicated. Continuing from the full state (rptr=wptr) and assuming no writes and only reads, the rptr will reach an almost empty state when it is at or within a read pointer offset distance of the wptr. The reads can continue, until the rptr equals the wptr, and the FIFO is in the empty state. If there is a further read, a read error will be indicated. The normal operation of the FIFO includes both multiple reads and writes and the almost full, full, empty, and almost empty states may occur in one or more combinations.

Figure 1A:
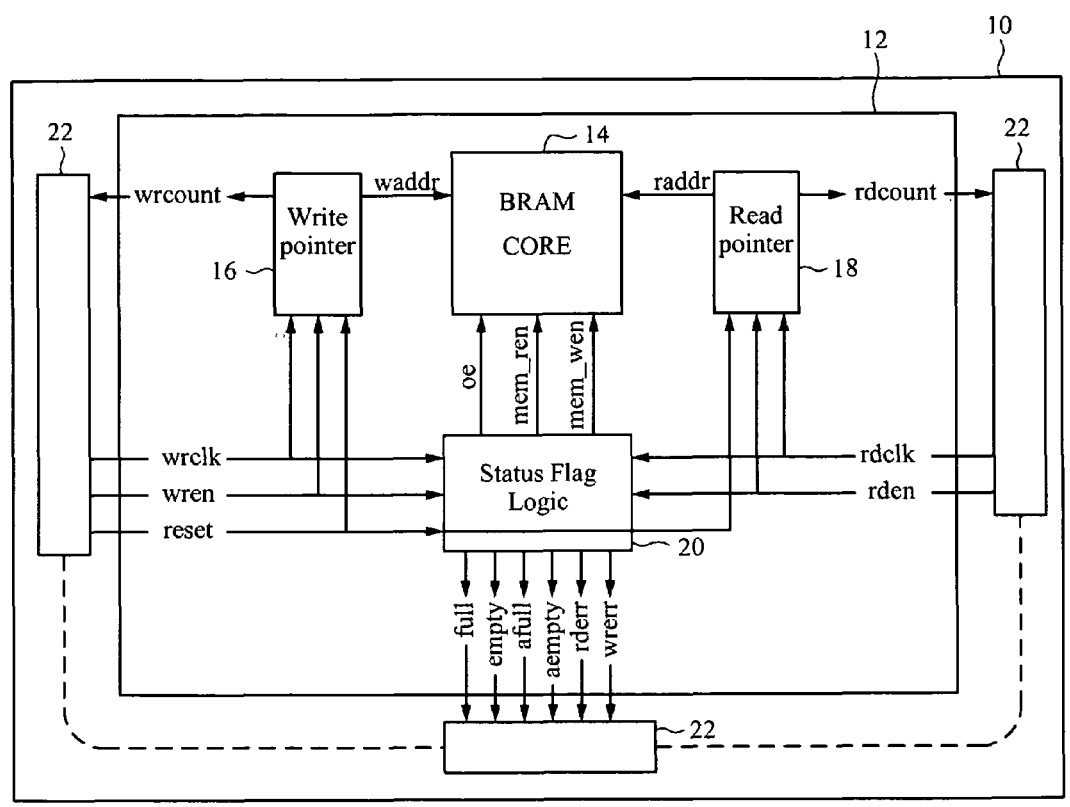
FIG. 1A is a diagram of a PLD with an embedded FIFO memory system according to an embodiment of the invention.

FIG. 1A is a diagram of an IC such as PLD 10 with an embedded FIFO memory system 12 according to an embodiment of the invention. The embedded FIFO memory system 12 includes a BRAM (which in this embodiment is illustrated as a dual-port RAM, but is alternatively a single-port RAM) 14 and various embedded FIFO logic circuits, such as a write pointer 16, a read pointer 18, and status flag logic 20. Data (not shown), WRITE COUNTER ("wrcount"), WRITE ADDRESS ("waddr"), READ ADDRESS ("raddr"), READ COUNT ("rdcount"), READ CLOCK ("rdclk"), READ ENABLE ("rden" or "ren"), WRITE ERROR ("wrerr"), READ ERROR ("rderr"), ALMOST EMPTY ("aempty"), ALMOST FULL ("afull"), EMPTY, FULL, RESET, WRITE ENABLE ("wren"), WRITE CLOCK ("wrclk") and similar signals are coupled between the embedded FIFO memory system 12 and fabric portion(s) 22 of the PLD 10. Data is stored in the BRAM 14 in a circular file system.

The embedded FIFO memory system 12 is an asynchronous FIFO memory system, which means that the data values are written to the BRAM 14 using one clock domain (wrclk) and the data values are read from the BRAM 14 using another clock domain (rdclk). The FIFO logic circuits perform the necessary read and write pointer management tasks and generate status flags, such as FULL, ALMOST FULL, ALMOST EMPTY, and EMPTY. The write pointer and read pointer are fully synchronous within their respective clock domains, but the read clock and the write clock are asynchronous to each other.

In a specific embodiment, the maximum depth of the FIFO memory system is programmable from 512 entries to 2046 entries. When the read pointer equals the write pointer, either the EMPTY flag or the FULL flag will be generated, depending on the direction the pointer is moving, as is described in further detail below in section II. Basically, if the ALMOST EMPTY condition has been and continues to be asserted, then the FIFO memory buffer will be empty when subsequently the read and write pointers are equal. If the ALMOST FULL condition has been and continues to be asserted, then the FIFO memory buffer will be full when subsequently the read and write pointers are equal.

A RESET signal resets all flops and initializes the FIFO status flags after power-up (power on). The RESET signal may be asynchronous or synchronous. The RESET signal is typically kept HIGH for a sufficient number of read clock and write clock cycles to ensure that all internal states are reset to the correct values. When RESET is asserted HIGH, EMPTY and ALMOST EMPTY status flags are set to "1" and FULL and ALMOST FULL status flags are set to "0".

If enabled, the read pointer increments on every read clock cycle. When the read pointer reaches a selected offset, an ALMOST EMPTY flag will be generated. For example, if the selected offset is ten, the ALMOST EMPTY flag will be generated when the read pointer is equal to or within ten addresses of the write pointer in the FIFO memory array. If the read pointer address reaches (i.e. increments until it equals) the write pointer address, the EMPTY flag will be generated. If there is another read then the read pointer will freeze and a read error flag is generated and, sent to the fabric 22 and/or off-chip (i.e. to a circuit/IC external to the PLD 10). An error routine may be executed which may include resetting the read pointer to the write pointer.

The write pointer operates in a similar way as the read pointer. If enables, the write pointer advances one address on every write clock cycle. When the write pointer reaches a selected offset, an ALMOST FULL flag will be generated. The selected offset for the write pointer does not have to equal the selected offset for the read pointer. In addition the write pointer offset and read pointer offset are integer numbers. In an exemplary embodiment of the present invention, the write pointer offset is a positive number and the read pointer offset is a positive number.

When the write pointer reaches the read pointer, the write pointer will stop ("freeze"). Further attempts to write data to the FIFO memory will trigger a WRITE ERROR signal (flag). The WRITE ERROR flag is sent to a data transmitting device, which could be a portion of the fabric of the PLD or an external data transmitting device, to prevent writing to a full BRAM 14. An error routine may be executed which may include resetting the write pointer to the read pointer.

The write pointer is in the WRITE CLOCK domain and the read pointer is in the READ CLOCK domain. Reading data from the BRAM 14 is done on the rising READ CLOCK signal when READ ENABLE is valid, as long as the BRAM 14 is not empty. If the READ ENABLE is still asserted when the BRAM 14 is empty, the read pointer will be frozen and a READ ERROR signal will be generated. Similarly, writing data to the BRAM 14 is done on the rising edge of the WRITE CLOCK signal when WRITE ENABLE is valid, as long as the BRAM 14 is not full. If the WRITE ENABLE is still asserted when the BRAM 14 is full, the write pointer will be frozen so that the data in the FIFO queue will not be corrupted, and then a WRITE ERROR signal will be generated.

In a specific embodiment, the FIFO memory system 12 is configured in a variety of organizations, for example: 4k entries by 4 bits, 2k entries by 9 bits, 1k entries by 18 bits, or 512 entries by 36 bits. These configurations are exemplary only to illustrate the flexibility of FIFO systems according to some embodiments of the invention. The organizations vary according to the size and/or type of the BRAM used, and in some embodiments, BRAMs are concatenated or otherwise combined to obtain other organizations (i.e. widths and depths).

Some embodiments of the invention can be described with state diagrams and use binary logic circuits to determine the status of the FIFO memory buffer (e.g. BRAM) before converting the binary code to Gray code for the status flag, as discussed in further detail in section IV, below.

Figure 1B:
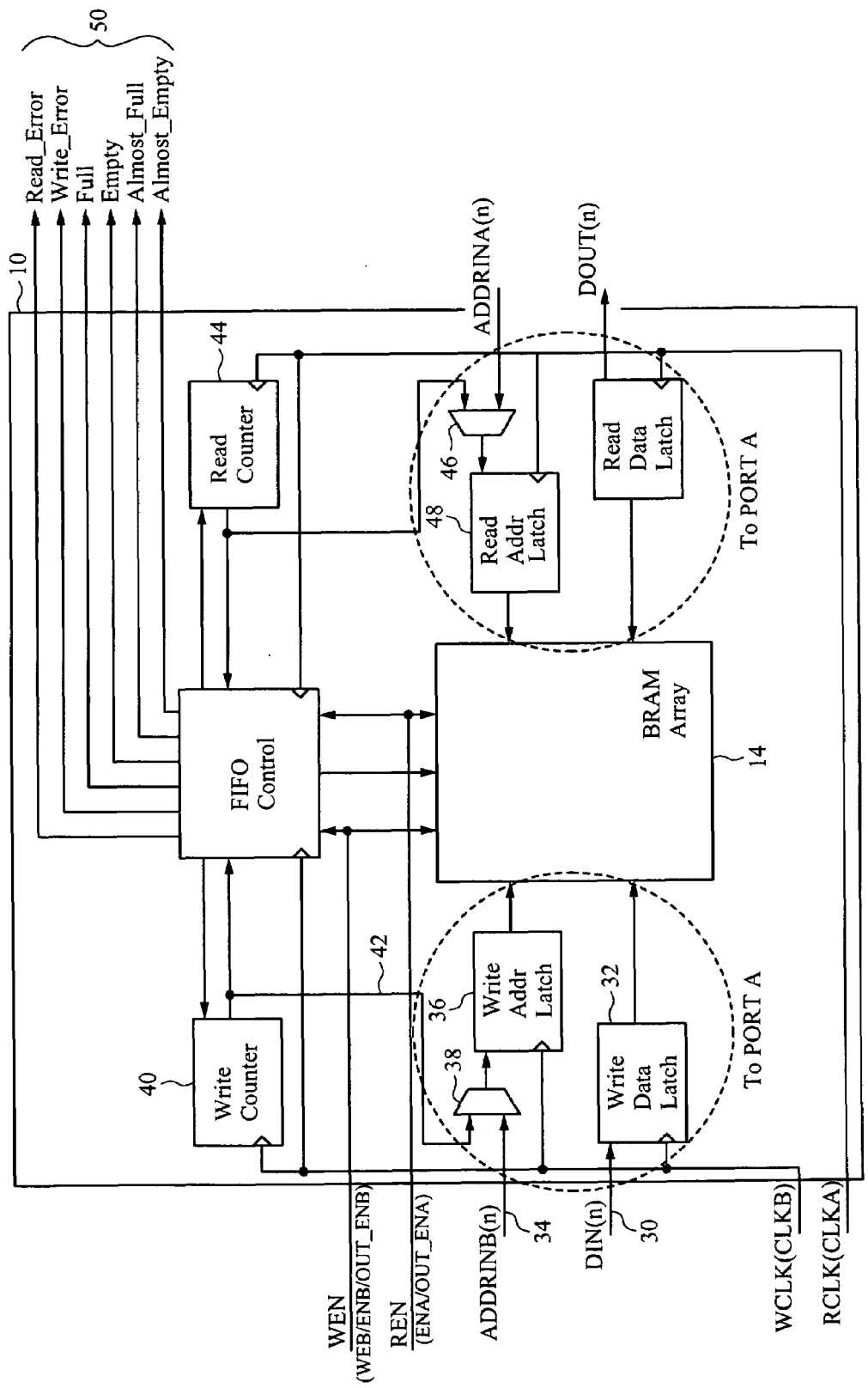
FIG. 1B is a diagram of the PLD of FIG. 1A showing additional details of the embedded FIFO memory system.

FIG. 1B is a diagram of the PLD 10 of FIG. 1A showing additional details of the embedded FIFO memory system. The BRAM array 14 has two ports, A and B (i.e. it is a two-port BRAM array). The same BRAM array can be used as part of a FIFO memory system, or as a conventional BRAM in the PLD 10. In a conventional application, input data ("DIN") 30 is written to the Write Data Latch 32, and then to the BRAM array 14. The input address of port B (ADDRINB(n)) 34 is provided from the fabric (see FIG. 1A, ref. num. 22) or off-chip to the Write Address Latch 36 through the multiplexer 38.

The multiplexer 38 selects between using the conventional write address 34 and the write address 42 provided by the Write Counter 40. In other words, the multiplexer selects between using the BRAM array 14 in a conventional memory fashion, or as a FIFO memory array in an embedded FIFO memory system.

When the BRAM array 14 is used in an embedded FIFO memory system, the multiplexer couples the write address 42 from the Write Counter 40 of the FIFO memory system to the Write Address Latch 36, and allows using the BRAM array 14 in a known manner by coupling the external input address 34 to the Write Address Latch 36. The Read Counter 44, multiplexer 46, and Read Address Latch 48 operate in a similar fashion.

The FIFO memory system status flags 50 are shown as going off chip, but are routed to logic blocks (not shown) of the PLD 10 in alternative embodiments.

Figure 2A:
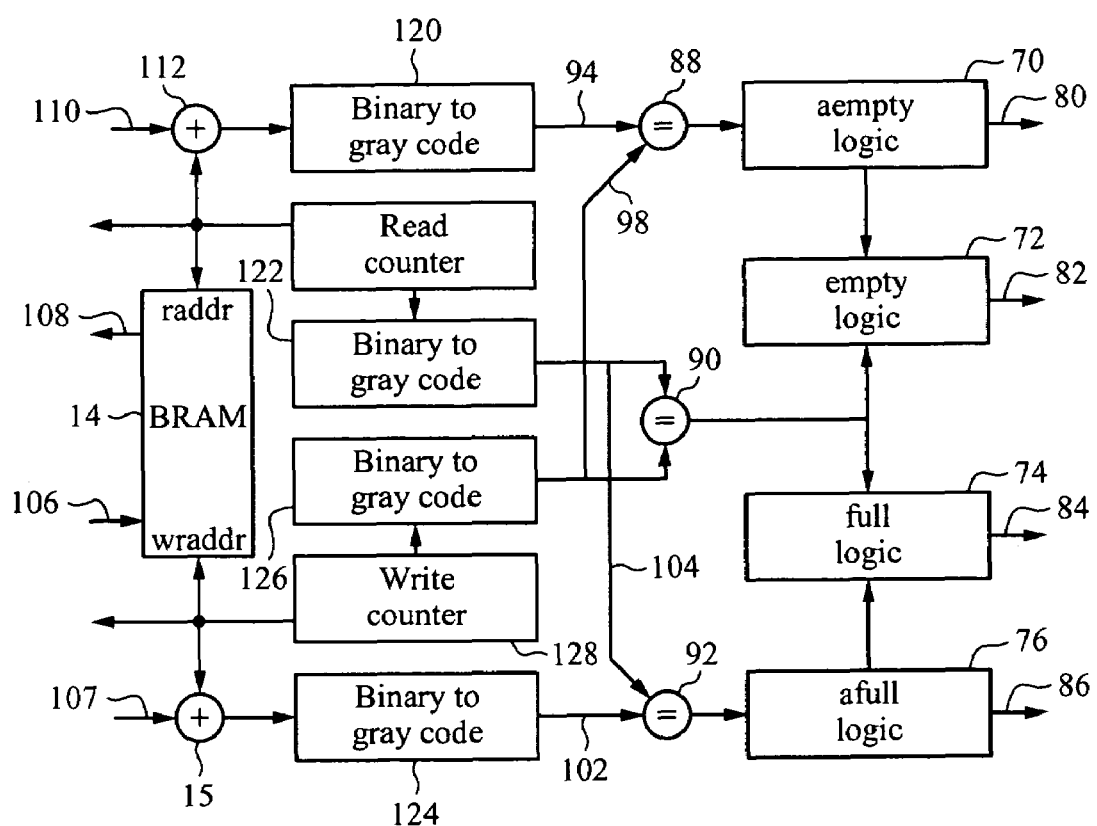
FIG. 2A is a block diagram of a portion of a FIFO memory system.

FIG. 2A is a block diagram of a portion of a FIFO memory system according to an embodiment of the present invention. ALMOST EMPTY logic 70, EMPTY logic 72, FULL logic 74, ALMOST FULL logic 76, and their associated outputs 80, 82, 84, 86 are shown. The ALMOST EMPTY comparator 88, FULL/EMPTY comparator 90, and ALMOST FULL comparator 92 receive input in both the read clock domain and in the write clock domain. The ALMOST EMPTY comparator 88 receives input 94 from the binary-to-Gray code generator 120 operating in the READ CLOCK domain, and receives input 98 from another binary-to-Gray counter 126 operating in the WRITE CLOCK domain. Similarly, the ALMOST FULL comparator 92 receives input 102 in the WRITE CLOCK domain, and input 104 in the READ CLOCK domain. The ALMOST EMPTY output (ALMOST EMPTY status flag) 80 and EMPTY output (EMPTY status flag) 82 are in the READ CLOCK domain, and the ALMOST FULL output (ALMOST FULL status flag) 86 and FULL output (FULL status flag) 84 are in the WRITE CLOCK domain. DATA IN 106 is written to the BRAM 14 in the WRITE CLOCK domain, and DATA OUT 108 is read from the BRAM 14 in the READ CLOCK domain.

The block includes four binary-to-Gray code generators 120, 122, 124, 126. Using Gray code for generating status flags of FIFO memory systems is known; however, in conventional FIFO memory systems, offsets for programming the ALMOST EMPTY and ALMOST FULL conditions are added as Gray code to the read and write counters before comparing.

The early warning flags, i.e., almost full and almost empty, are based on detecting a specified arithmetic difference between the two addresses for read and write. Comparing binary addresses would inevitably create decoding spikes and glitches, since one clock edge often changes multiple address bits, and these changes can affect the identity comparator at slightly different times. The well-known solution to this problem is to use Gray-coded address counters; however, arithmetic operation on Gray-coded addresses is extremely complex. Thus, in one embodiment of the present invention, the required offset (positive or negative) is added from the binary address value of either the write or the read address, and the result is then converted into a Gray code. This offset Gray-coded value is then identity-compared with the Gray-coded value of the other address. The output of this comparator is active whenever the read and write addresses differ by the offset.

In the block diagram of FIG. 2A, the ALMOST EMPTY ("AEMPTY_OFFSET") offset 110, for example, is added by adder 112 as a binary number (i.e. in the binary domain), and then converted to Gray code in the binary-to-Gray code generator 120 before being compared 88 to the output 98 of the WRITE COUNTER 128, which has also been converted to gray code by another binary-to-Gray code generator 126. Detailed discussion of the complementary paths is omitted, as they would be familiar to one of ordinary skill in the art.

Figure 2B:
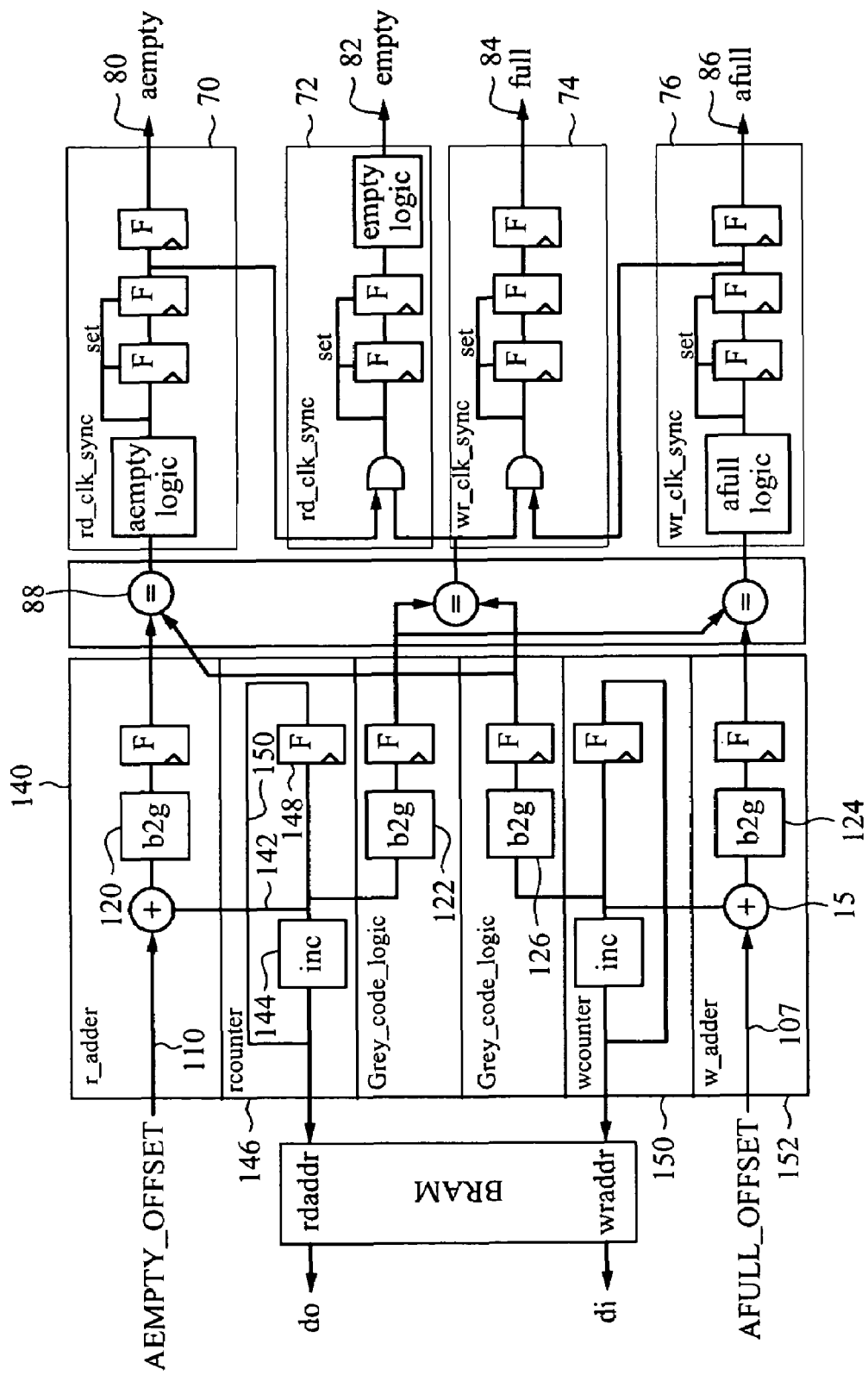
FIG. 2B is a logic diagram of the block diagram shown in FIG. 2A.

FIG. 2B is a logic diagram of the block diagram shown in FIG. 2A. As discussed in relation to FIG. 2A, the READ ADDER 140 receives a binary ALMOST EMPTY offset 110, which is added to the binary output 142 from the incrementor 144 in the READ COUNTER 146 before being converted to Gray code in the binary-to-Gray converter 120. The comparator 88 is 12-bit Gray code comparator that uses static gates. The read pointer generation is done using the incrementor 144 and a flip-flop 148. The output 150 of the flip-flop 148 is fed back to the input of the incrementor 144. The control signals to the incrementor are FULL, EMPTY, READ ENABLE, WRITE ENABLE, and CLOCK. The write pointer is generated in a similar fashion, and a detailed description is omitted. The ALMOST EMPTY 80, EMPTY 82, FULL 84, and ALMOST FULL 86 outputs and synchronization logic circuits are discussed in further detail below.

FIG. 2B, also shows the binary-to-Gray converters 120, 122, 124, 126, WRITE COUNTER 150, WRITE ADDER 152, ALMOST EMPTY logic 70, EMPTY logic 72, FULL logic 74, and ALMOST FULL logic 76 and their associated outputs 80, 82, 84, 86.

II. An Almost Full, Almost Empty FIFO Memory System

Figure 3A:
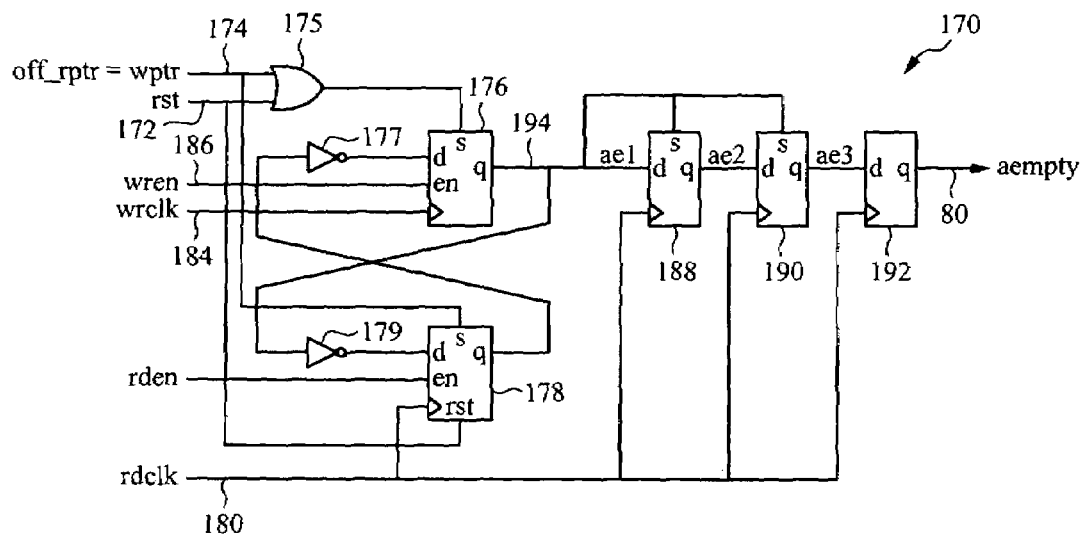
FIG. 3A is a circuit diagram of an ALMOST EMPTY detection circuit.
Figure 3B:
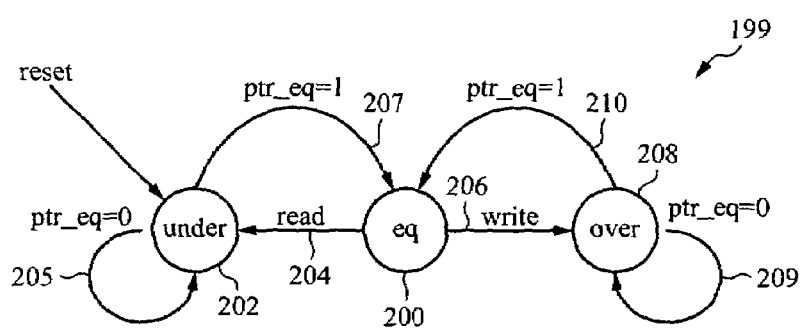
FIG. 3B is a state diagram of an ALMOST EMPTY logic function.

FIGS. 3A and 3B generally show buffer memory status detection circuits. These circuits are embedded in a programmable logic device, such as an FPGA or CLD. These detection circuits detect when a first address pointer of an embedded FIFO memory array equals the sum of a second address pointer plus a selected offset, and also convert the output signal (FIFO status flag) to the proper clock domain.

FIG. 3A is a circuit diagram of an ALMOST EMPTY detection circuit 170 (similar to circuit 70 in FIG. 2B). Conventional Gray-code ALMOST EMPTY (or ALMOST FULL) circuits are normally required to implement a "greater than" function, which consumes a considerable amount of silicon area on the chip. An embodiment of the present invention uses a state machine to monitor the write and read pointer movement.

When RESET 172 is asserted high (resetting the wtpr–rptr), the ALMOST EMPTY output (status flag) 80 is set to "1" by asynchronously setting the first flip-flop 176 to "1". The first flip-flop 176 and second flip-flop 178 (flip-flops are also referred to as flops herein) are cross-coupled through inverters 177, 179. When the output q of the first flop 176 is "1", the inverter 179 provides a "0" to the data port d of the second flop 178. The output q of the second flop 178 is coupled to the data port d of the first flop 176 through the inverter 177. Thus the "0" output from the second flop 178 is converted to a "1" at the data port of the first flop 176.

If, for example, there are a series of writes with no reads, then wprt will increase until wprt=rptr+aempty offset, i.e., wprt=off_rtpr, where aempty offset is a user selected positive number. When the output of identity comparator 80, e.g., signal 174 (wptr=off_rptr), is asserted, flop 176 is asynchronously set to "1" via OR gate 175 and flop 178 is asynchronously set to "1". Output 194 is thus "1" and the inputs to flops 176 and 179 are "0". Flops 188 and 190 are then set to "1". If there is another write clock (wrclk 184) with the write enable (wren 186) asserted and wptr>rptr_off, then both the q output 194 of flop 176 and the q output of flop 178 becomes "0". The d input 179 to flop 178 becomes "1". As long as wptr>rptr_off, there may then follow a series of write clocks and read clocks. Two read clocks will propagate the "0" at q 194 through flops 188 and 190 to set ae3="0". After another read clock (with wptr>rptr_off), the aempty status flag is "0". Flop 192 is an optional pipeline register that will be discussed below. The two read clock cycles synchronized AEMPTY back to the write clock domain.

In the above example, if there is a read clock after off_rptr=wptr, i.e., wptr<off_rptr, and read enable (rden) is asserted, then output q 194 of flop 194 remains "1" and the aempty flag remains asserted.

The first two flops 188, 190 (also known as synchronization registers) in the output path are both clocked by the READ CLOCK signal (rdclk) 180. The input ae1 to the first flop 188 can be across clock domains; however, the second flop 190 insures that ae2 is in the READ CLOCK domain. The optional third flop 192 in the output path is a pipeline register that improves the output timing of the ALMOST EMPTY (aempty) status flag 80 because it is controlled only by the READ CLOCK signal 180. The pipeline register 192 is especially desirable when either or both of the WRITE CLOCK and READ CLOCK are high-frequency clocks.

FIG. 3B is a state diagram 199 of an ALMOST EMPTY logic function, such as the ALMOST EMPTY logic function shown in FIG. 3A. There are three states in this state machine: 1) the under state has wptr not equal to off_rptr, i.e., ptr_eq= 0; in this under case wptr<off_rptr (i.e., the write pointer is less than the read pointer+aempty offset); 2) the equal state has wptr=off_rptr (i.e., ptr_eq=1); and 3) the over state has wptr not equal to off_rptr, i.e., ptr_eq=0; in this over case wptr>off_rptr.

A RESET signal places the write pointer and read pointer to the same memory address, which puts the state machine into the under state 202 because of the read pointer offset (i.e., wptr<off_rptr). Initially, the ALMOST EMPTY flag is set. As write operations occur with ptr_eq=0 205, the FIFO memory array fills up. As read operations occur with ptr_eq=0 205, the FIFO memory array empties. When ptr_eq=1 207 (see FIG. 3A, ref. num. 174), the state machine transitions into the equal state 200, which keeps the ALMOST EMPTY flag set. The arrows are combinational (independent of clock domain). The states are clocked.

A write operation 206 from the equal state 200 transitions the state machine to the over state 208 (wprt>off_rptr) and resets the AMOST EMPTY flag. Continued write operations 209 keep the state in the over state 208 until sufficient read operations have occurred to attain ptr_eq=1 210 (i.e., off_rptr=wptr), which transitions the state machine to the equal state 200 and sets the ALMOST EMPTY status flag (asserted) when the state machine is in the equal state 200. If an additional read operation occurs, ptr_eq does not equal "1", and the state machine transitions 204 to the under state 202 from the equal state 200 and the ALMOST EMPTY flag remains set.

When the system is either in the under state 202 or equal state 200, the ALMOST EMPTY flag is set (i.e., if wptr= <rptr+aempty offset, then ALMOST EMPTY=1). In the over state, the ALMOST EMPTY flag is reset (i.e., if wptr>rptr+aempty offset, then ALMOST EMPTY=0).

Figure 4A:
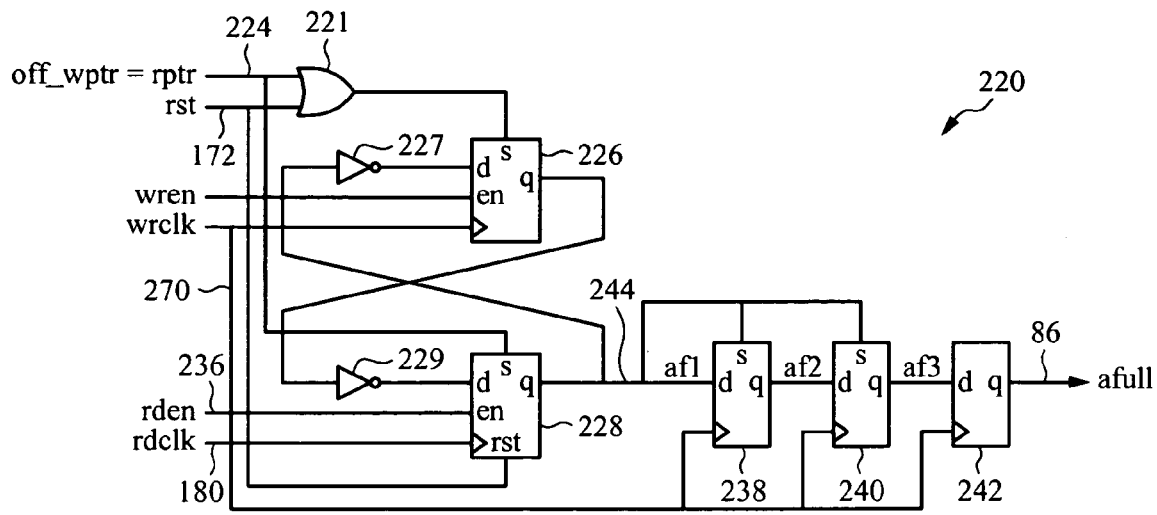
FIG. 4A is a circuit diagram of an ALMOST FULL detection circuit.

FIG. 4A is a circuit diagram of an ALMOST FULL detection circuit 220 (similar to circuit 76 in FIG. 2B). The ALMOST FULL detection circuit 220 works similarly to the ALMOST EMPTY detection circuit 170 shown in FIG. 3A, with some differences. The RESET signal 172 is provided to an OR gate 221, as is the signal 224 when the offset write pointer (i.e., off_wptr=wprt+afull offset) equals the read pointer (rptr), where afull offset is a positive number. The ALMOST FULL status flag (afull) 86 is set to "0" at reset, instead of to "1", as is the ALMOST EMPTY status flag 80 of FIG. 3A. The ALMOST FULL detection circuit 220 also has two flops 226, 228, cross-coupled thorough inverters 227, 229.

The "lower" flop 228 is clocked by the READ CLOCK signal 234 when READ ENABLE 236 is asserted. The "upper" flop 226 is clocked by the WRITE CLOCK signal (wrclk) 230, as are the synchronization registers 238, 240, and pipeline register 242 . . . . When the offset write pointer equals the read pointer 224 (i.e. when the ALMOST FULL condition is met), the lower 228 and upper 226 flops are set, which produces a "1" on the output (af1) 244 of the lower flop 228. The first 238 and second 240 synchronization registers are set when the output 244 of the lower flop 228 is asserted and af3=1 and after a write clock, afull flag is set. Further discussion of circuit 220 is omitted as the operation is similar to the description of the almost empty circuit.

Figure 4B:
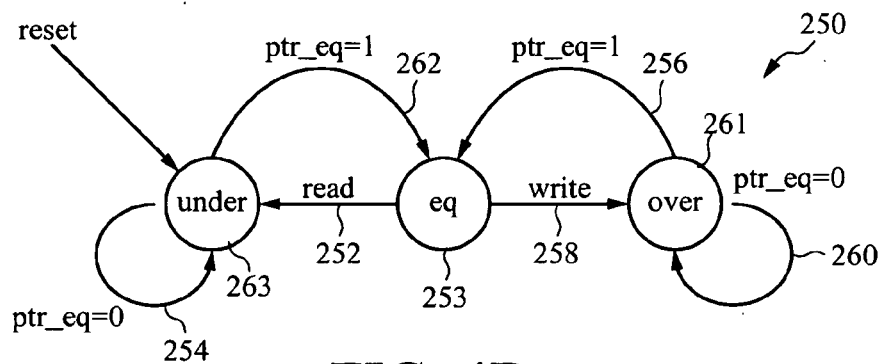
FIG. 4B is a state diagram of an ALMOST FULL logic function.

FIG. 4B is a state diagram 250 of an ALMOST FULL logic function. The state diagram operates in a similar fashion to the state diagram 199 shown in FIG. 3B except that ptr_eq=1 means that off_wprt=rptr, ptr_eq=0 means that off_wprt is not equal to rptr and the almost full status flag is reset in the under state 263 (afull=0) and set in the equal 253 and over 261 states (afull=1).

At reset the state machine 250 starts in the under state 263. Reads and writes are made to the FIFO until there are sufficient writes to have prt_eq=1 (i.e., off_wptr=rptr, see 224 of FIG. 4A). Once the equal state 253 is reached, the equal state 253 and the over state 261 (reached from the equal state 253 by a further write operation 258) and will keep the ALMOST FULL signal asserted afull=1 when wptr+afull offset>=rptr) until the a read operation transitions the state machine from the equal state 253 to the under state 263, i.e., when rprt<off_wptr. In the under state 263 the ALMOST FULL output 86 will be deasserted (after a three read clock cycle delay). The operation of the state diagram 250 is understood by those of skill in the art with reference to the description of FIG. 3B, hence a further description of the operation of the state diagram 250 is omitted. Hence, if ALMOST FULL is asserted, and the read pointer equals the write pointer, then we know that the FIFO memory buffer is full.

Figure 5A:
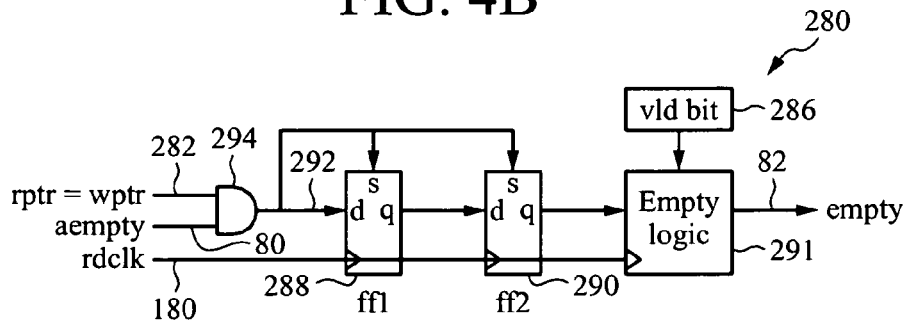
FIG. 5A is a diagram of a circuit for generating an EMPTY flag.

FIG. 5A is a diagram of a circuit 280 for generating an EMPTY flag 82 (similar to circuit 72 in FIG. 2B). The EMPTY flag 82 is generated if the read pointer equals the write pointer 282 (i.e. the FULL/EMPTY comparator (see FIG. 2A, ref. num. 90) is asserted), the ALMOST EMPTY signal status flag 80 is asserted, and the DATA VALID bit (vld bit) 286 is not set. When the DATA VALID bit is zero, it indicates that data in output register is not valid, and the EMPTY flag is set (see also, FIGS. 7A, 7B, and related description). When DATA VALID is "1", it indicates the data in the output register is valid, and the EMPTY flag is not set, even though the BRAM array may be empty.

In some embodiments of FIFO memory systems, latency is reduced by sending the first written data directly to an output register, so that the data is available to be read on the first read cycle. In other embodiments, the first written data is sent to the output of an output register, so that the data is available to be read before the first read cycle. In other words, the VALID BIT (vld bit) 286 monitors whether valid data is available in the output register. In some modes of operation, the read cycles might keep the output register empty, so that successive write cycles (words) go directly to the output buffer. In such an instance, data is available to be read, even though the FIFO memory array is empty (WRITE POINTER=READ POINTER 282 and ALMOST EMPTY status flag 80 is asserted). When the FIFO memory array is empty, and the output data register is not valid, the EMPTY status flag 82 is generated by the EMPTY LOGIC 291.

Two stages of asynchronously set registers 288, 290 are used to synchronize the EMPTY flag 82 back to the READ CLOCK domain by gating the registers 288, 290 with the READ CLOCK signal 180 and setting the registers 288, 290 with the output 292 from the AND gate 294. These registers also filter out glitches that might occur on the EMPTY status flag (empty) output 82, as discussed above in relation to FIGS. 3A and 4A.

Using the ALMOST EMPTY signal 80 allows the circuit 280 to differentiate between FULL and EMPTY conditions of the FIFO memory array. The write pointer equals the read pointer in both conditions, but if the ALMOST EMPTY signal has been set, and the read and write pointers become equal, then the FIFO memory array is known to be empty, not full. Similarly, if the ALMOST FULL signal is set and then the read and write pointers become equal, then the FIFO memory array is known to be full.

Figure 5B:
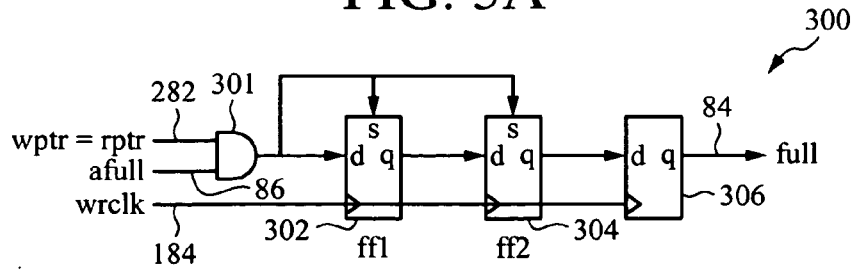
FIG. 5B is a diagram of a circuit for generating a FULL flag.

FIG. 5B is a diagram of a circuit 300 for generating a FULL status flag 84 (similar to circuit 74 in FIG. 2B). It is similar to the circuit 280 for generating an EMPTY status flag 82 shown in FIG. 5A, except the asynchronously set registers 302, 304 are gated by the WRITE CLOCK signal 184 and a pipeline register 306 is used instead of the EMPTY logic 291 shown in FIG. 5A. Similarly, the ALMOST FULL status flag 86 and output 282 from the FULL/EMPTY comparator (see FIG. 2A, ref. num. 90) are provided to the AND gate 301. The pipeline register 306 introduces one WRITE CLOCK 184 latency for both setting and resetting to improve timing of the FULL status flag 84 to the WRITE CLOCK.

III. A Reduced Cycle Latency FIFO in a PLD

Figure 6A:
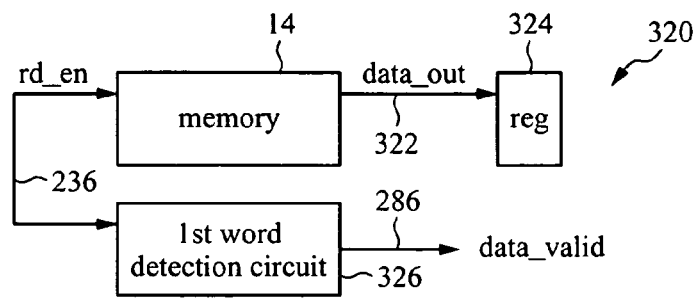
FIG. 6A is a diagram of a pre-fetch circuit for zero cycle latency.

FIG. 6A is a diagram of a pre-fetch circuit 320 for zero cycle latency. The first word written to an empty FIFO memory array 14 (e.g. a BRAM of a PLD) is pre-fetched to the input 322 of the output register 324 after three transitions of the READ CLOCK signal (two sync cycles plus one pre-fetch cycle). READ ENABLE (rden) 236 does not have to be asserted for this to occur if the first word detection circuit 326 generates a data valid 286 signal (see also, FIG. 5A, ref. num. 286). Thus, the first word is read from the register 324 as soon as READ ENABLE 236 is asserted. However, reading the first word from the FIFO memory requires READ ENABLE 236 to be high and a rising READ CLOCK signal. These timing conditions are merely exemplary.

Figure 6B:
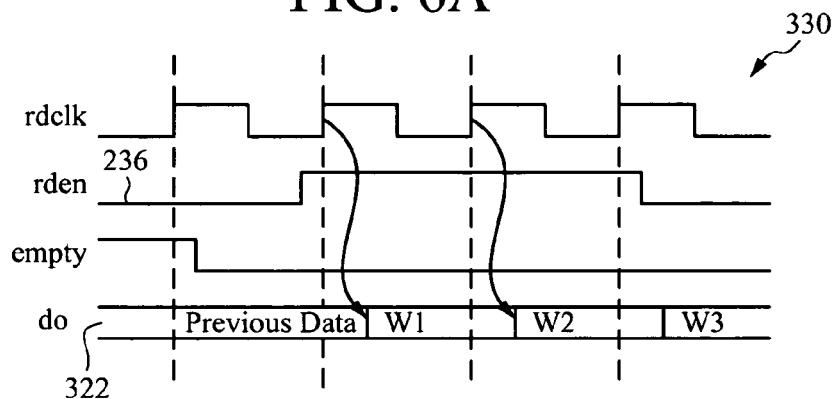
FIG. 6B is a read cycle timing diagram of a pre-fetch circuit for zero cycle latency

FIG. 6B is a read cycle timing diagram 330 of a pre-fetch circuit for zero cycle latency. The first word W1 is present in data out 322 essentially as soon as READ ENABLE 236 goes high. For example, referring to FIG. 6A, if only one write operation occurs, and a subsequent read operation occurs, both the memory 14 and the output register 324 are empty, and the data valid output 286 is not set. If one write operation occurs and no read operation occurs, the data (word) in the write operation goes to the output register 324 and the data valid output 286 is set, indicating that a word is available to be read, even though the memory 14 is empty.

Figure 7A:
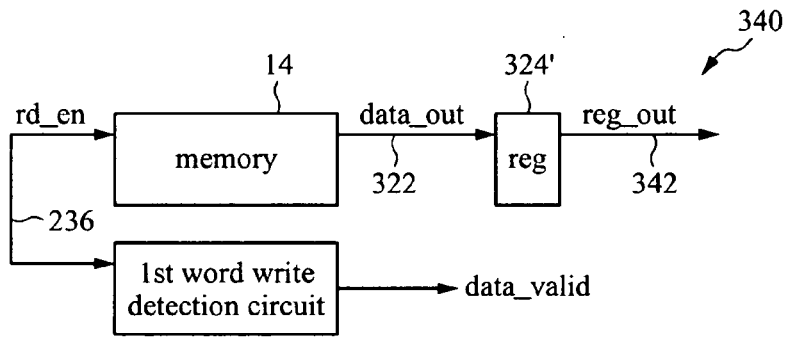
FIG. 7A is a diagram of a pre-fetch circuit for generating −1 cycle latency.

FIG. 7A is a diagram of a pre-fetch circuit 340 for generating −1 cycle latency, also known as first-word fall through ("FWFT"). FWFT mode allows the first word written to an empty FIFO memory array 14 (e.g. BRAM of a PLD) to be pre-fetched from the output 322 of the FIFO memory array 14 to the output 342 of an output register 324' after four transitions of the READ CLOCK signal (see FIG. 7B, rdclk 180) (i.e. two sync cycles and two pre-fetch cycles). READ ENABLE 236 does not have to be asserted for the first word to be read in FWFT mode; however, reading the next word from the FIFO memory array (assuming additional words have been written in the intervening time) does require a READ ENABLE signal for access. A FIFO memory system operating in FWFT mode produces a −1 cycle latency. In this embodiment, a DATA VALID output indicates that the register output 342 is valid.

Figure 7B:
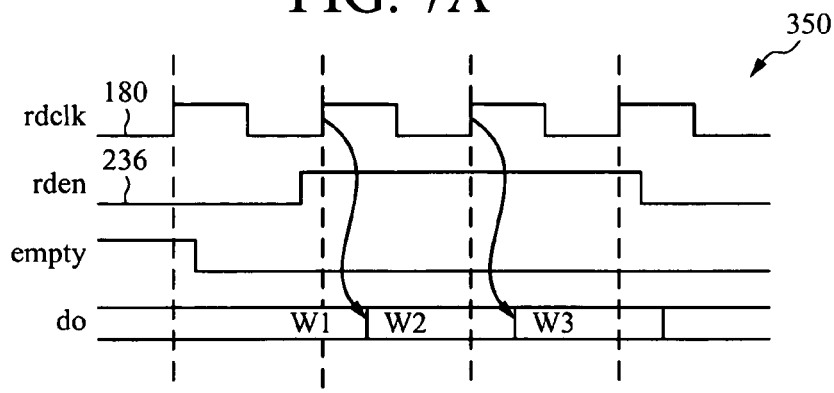
FIG. 7B is a diagram of a circuit for pre-loading a binary offset to a Gray-code counter.

FIG. 7B is a first-word fall through timing diagram 350. The first word W1 is available on data out (do) before READ ENABLE 236 is asserted. When READ ENABLE 236 goes high, the second word W2 is read on the associated rising edge of the READ CLOCK signal 180.

IV. A Method and System for Gray-Code Counting in a PLD

A 12-bit binary-to-Gray ("BTG" or "B2G") code converter gate level implementation (not separately shown) provides a first binary input and a second binary input to an exclusive NOR gate. The first input stream is shifted one place to the "right" (e.g. for a four-bit system, the first input data word 1111 becomes 0111; in other words, the most significant bit becomes "0" in the shifted binary input). The exclusive NOR gate converts the binary input and shifted binary input to Gray code. Performing the logic operation(s) in binary avoids generating the false outputs that can arise if the comparison is made in the Gray-code domain, after the binary inputs have been converted to Gray code, because the Gray code string has only one edge transition. Converting the binary inputs to Gray code before adding can produce intermediate transitions that cause glitches on the output Gray code.

Figure 8:
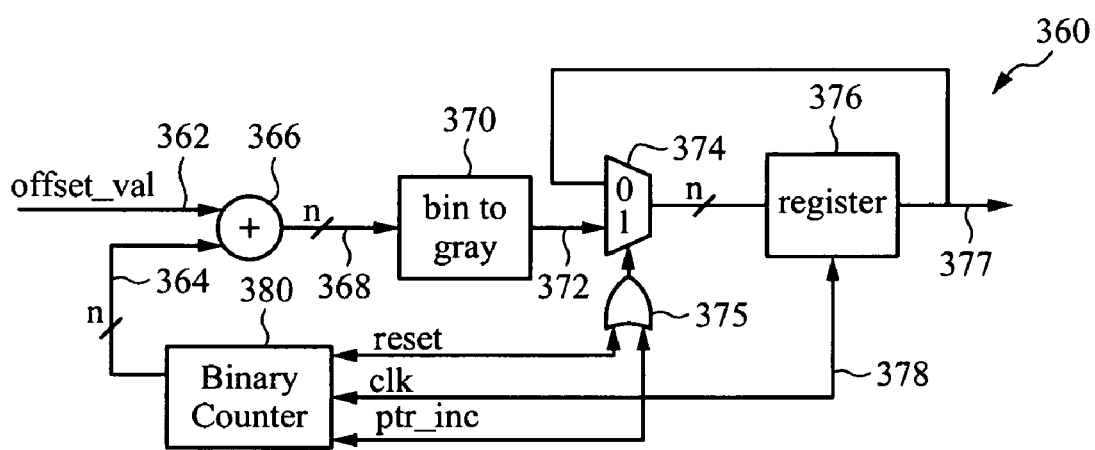
FIG. 8 is a diagram of a circuit for pre-loading a binary offset to a Gray-code counter.

FIG. 8 is a diagram of a circuit for pre-loading a binary offset to a Gray-code counter 360. A user-selectable binary offset value 362 and an n-bit binary count 364 are provided to a binary adder 366. The n-bit binary output 368 of the binary adder 366 is provided to a binary-to-Gray converter 770, which provides a Gray-code output to a multiplexer 374.

An OR gate 375 provides a select signal to the multiplexer 374. When the select signal is "1", the "1", port of the multiplexer (i.e. the output 372 of the binary-to-Gray converter 370) is coupled to the register 376. The select signal is "1" when either the reset signal or pointer increment (ptr_inc) signal is "1". A read pointer increment signal, for example, is generated when the READ CLOCK signal transitions and READ ENABLE is asserted. The Gray-code output of the binary-to-Gray converter 370 is provided through the multiplexer 374 to the register 376 each time the read pointer is incremented. The register 376 provides a Gray-code output 377 to the almost empty comparator (see FIG. 2A, ref. num. 88), for example. If the select signal from the OR gate 375 to the multiplexer 374 is "0", the output 377 of the register 376 is fed back through the multiplexer 374 to the register 376 (i.e. the value in the register does not change). Similarly, the write pointer increment signal is generated when the WRITE CLOCK signal transitions and WRITE ENABLE is asserted.

On reset, the binary counter 380 is set to "0", and the output 364 of the binary counter 380 is added 366 to the offset value 362, which is also in binary form. The sum 368 of the output 364 of the binary counter 380 and the binary offset value 362 is provided to the binary-to-Gray converter 370. At reset, the output 372 of the binary-to-Gray converter 370 represents the Gray-code value of the offset value, since the binary counter 380 is at zero.

The Gray-code value of the offset is typically not all "1's" or all "0's", thus simply resetting the binary-to-Gray code converter would not provide the desired selectable offset value, which can be a selected number of memory addresses, for example. Adding the offset value to the counter output in binary form is a quick, robust way to provide user-selectable offset values in Gray code from the register 376. Thus, the comparator (see, e.g., FIG. 2A, ref. num. 88) receives the user-selectable offset value as Gray code (i.e. the register 376 is loaded with the offset value in Gray code), and compares this value with the Gray code value of the write counter (see, e.g. FIG. 2A, ref. num. 98) to determine whether the FIFO memory buffer is almost empty.

As read operations occur (and while reset=0), the pointer increment signal (ptr_inc) increments the binary counter 380, and the output value 364 from the binary counter 380 is added 366 to the offset value 362, converted into Gray code, and provided to the register 376 through the multiplexer 374. Thus, the content of the register 376 will be updated.

A similar circuit is implemented for the write portions of the FIFO memory system (ref. generally, FIGS. 2A, 2B).

V. Exemplary Methods

Figures 1, 9A:
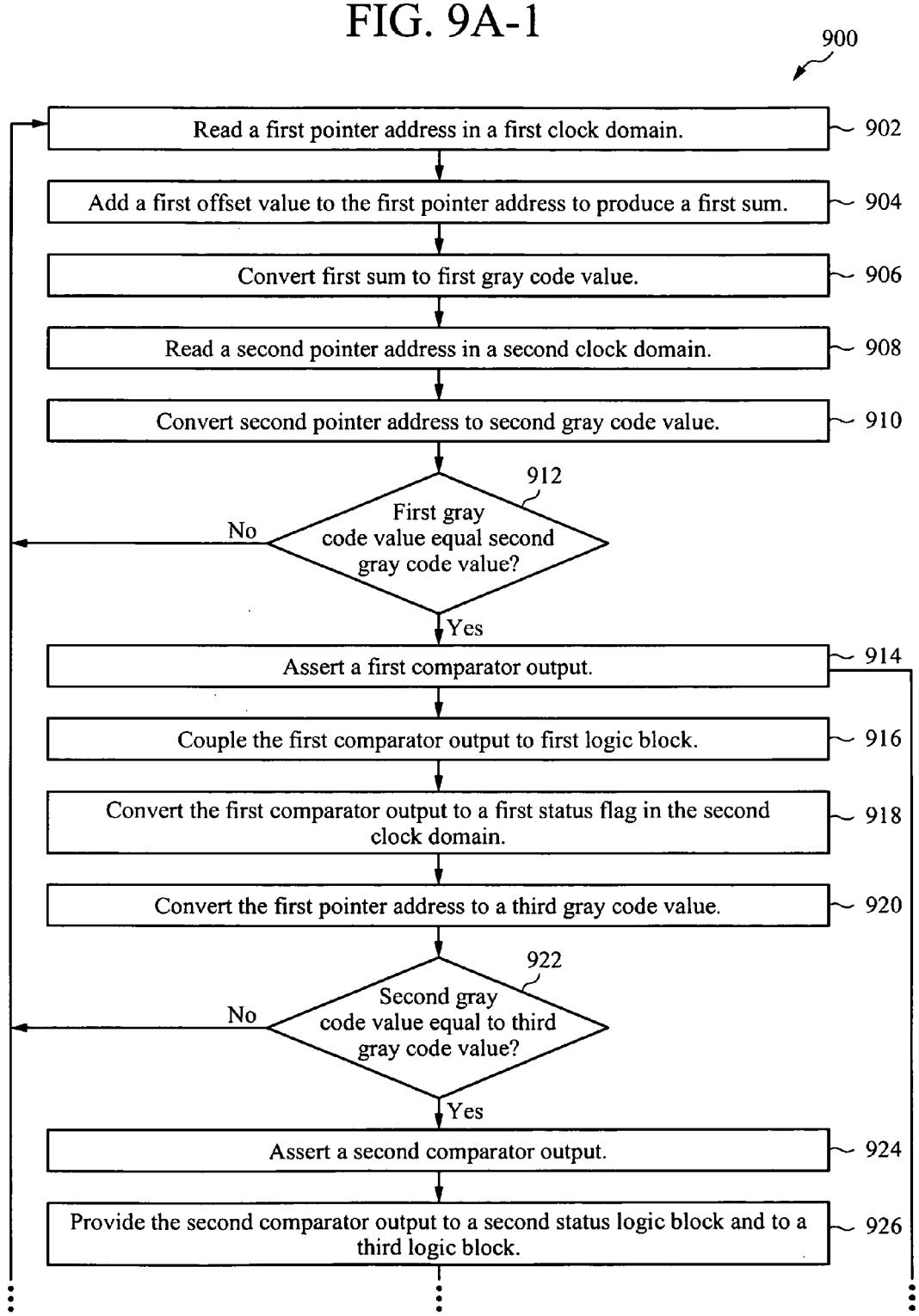
FIG. 9A is a flow chart of a method of operating an embedded FIFO memory system in a programmable logic device according to an embodiment of the invention.
Figures 2, 9A:
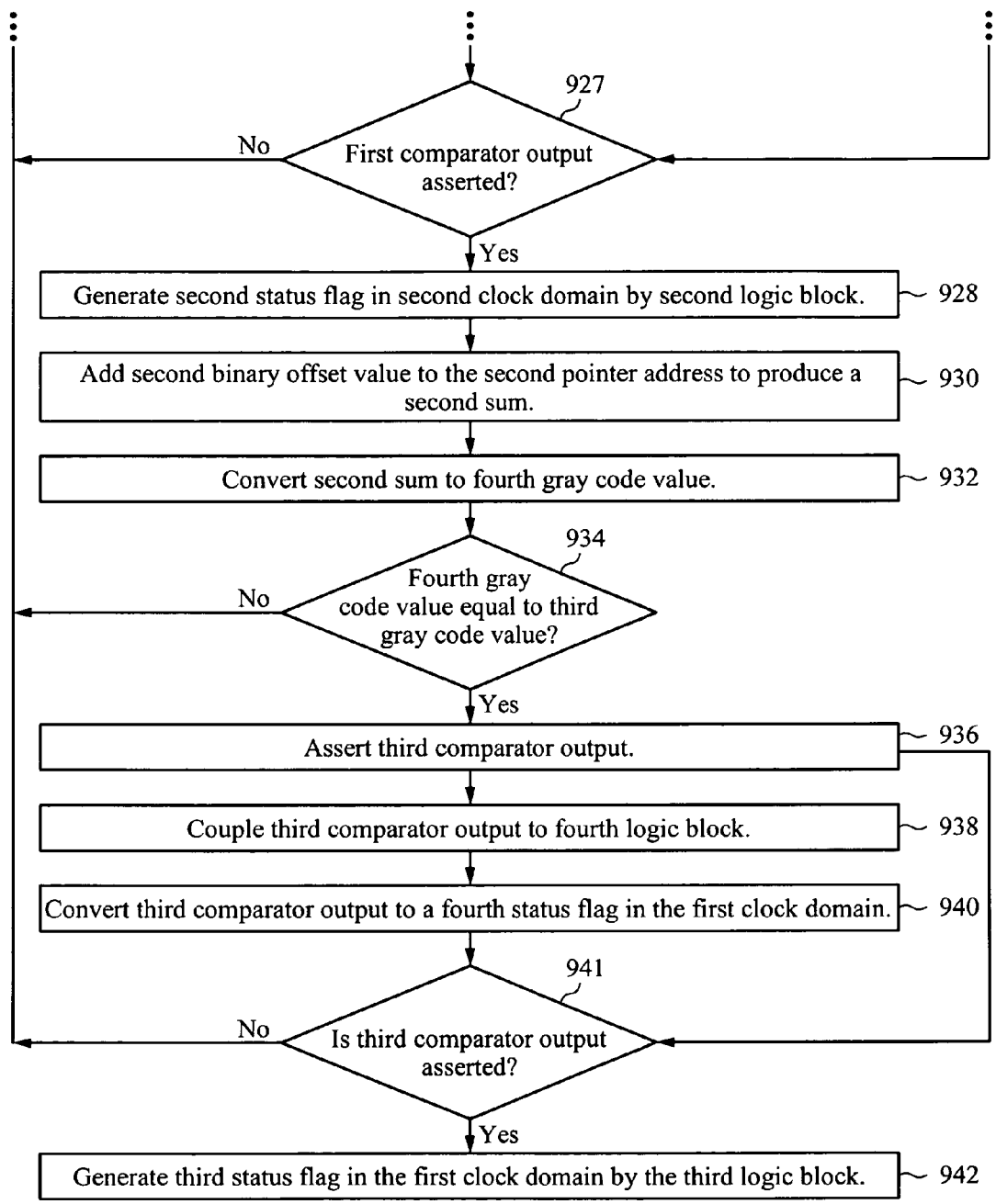

FIG. 9A is a flow chart of a method 900 of operating an embedded FIFO memory system in a programmable logic device according to an embodiment of the invention. A first pointer address from a FIFO memory array embedded in the programmable logic device is read in a first clock domain (step 902). A first binary offset value is added to the first pointer address to produce a first sum (step 904). The first sum is converted to a first Gray code value (step 906), and a second pointer address is read from the FIFO memory array in a second clock domain (step 908). The second pointer address is converted to a second Gray code value (step 910), and the first Gray code value is compared to the second Gray code value (decision 912). If the first Gray code value equals the second Gray code value, a first comparator output is asserted (step 914). The first comparator output is coupled to a first logic block (step 916), and is converted from the first clock domain to a first status flag in the second clock domain (step 918).

In further embodiments, the first pointer address is converted to a third Gray code value (step 920), and the second Gray code value is compared to the third Gray code value (decision 922). A second comparator output is asserted if the second Gray code value equals the third Gray code value (step 924). The second comparator output is supplied to both a second logic block and to a third logic block (step 926), such as an EMPTY logic block and a FULL logic block.

If the first comparator output is asserted (decision 927), a second status flag is generated by the second logic block in the second clock domain (step 928). For example, if the first comparator output drives ALMOST EMPTY logic and the second comparator output is asserted, which indicates that read pointer position equals the write pointer position in the BRAM, for example, the EMPTY logic block generates an EMPTY status flag.

In another or further embodiment, a second binary offset value is added to the second pointer address to produce a second sum (step 930). The second sum is converted to a fourth Gray code value (step 932), and the fourth Gray code value is compared to the third Gray code value (decision 934). A third comparator output is asserted if the fourth Gray code value equals the second Gray code value (step 936). The third comparator output is coupled to a fourth logic block (step 938) that converts the first comparator output from the second clock domain to a fourth status flag in the first clock domain (step 940). In an alternative embodiment, if the third comparator output is asserted (decision 941), a third status flag is generated by the third logic block in the first clock domain (step 942). The order in which the steps are described is not limiting, and many steps can be performed essentially concurrently or in alternative sequences.

Figure 9B:
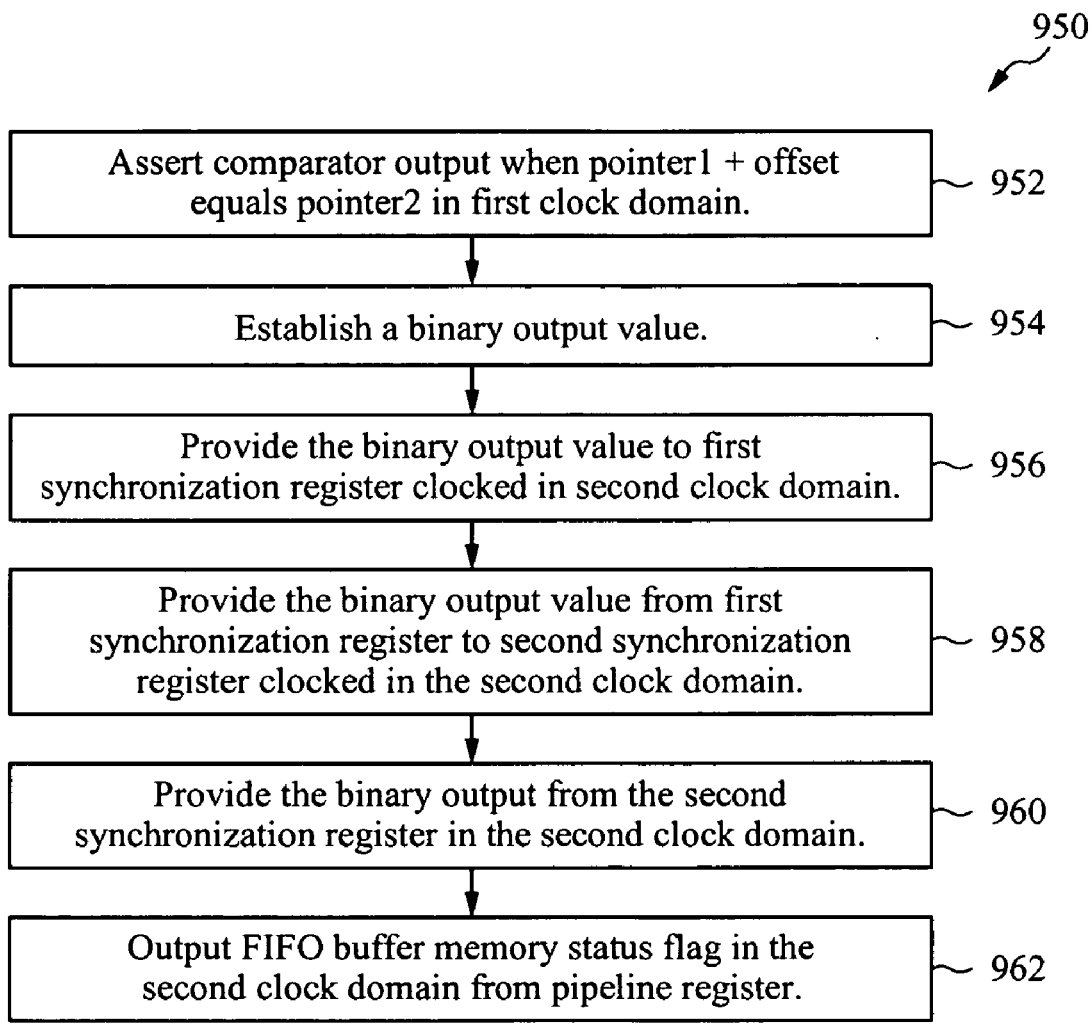
FIG. 9B is a simplified method of detecting buffer memory status in a FIFO memory system.

FIG. 9B is a simplified method 950 of detecting buffer memory status in a FIFO memory system. A comparator output is asserted when a sum of a first pointer value and a selected pointer offset value equals a second pointer value in a first clock domain (step 952). A binary output value is established when the comparator output is asserted (step 954). The binary output value, which is generally in the first clock domain but may have additional transitions (glitches), is provided to a first synchronization register set by the binary output and clocked in a second clock domain (step 956). The binary output value from the first synchronization register is provided to a second synchronization register that is also set by the binary output value and clocked in the second clock domain (step 958). The second synchronization register provides the binary output value in the second clock domain (step 960).

In a further embodiment, the binary output value from the second synchronization register is provided to a pipeline register clocked in the second clock domain and the pipeline register outputs a FIFO buffer memory status flag, such as an ALMOST EMPTY or ALMOST FULL FIFO memory buffer status flag, in the second clock domain (step 962).

Figure 9C:
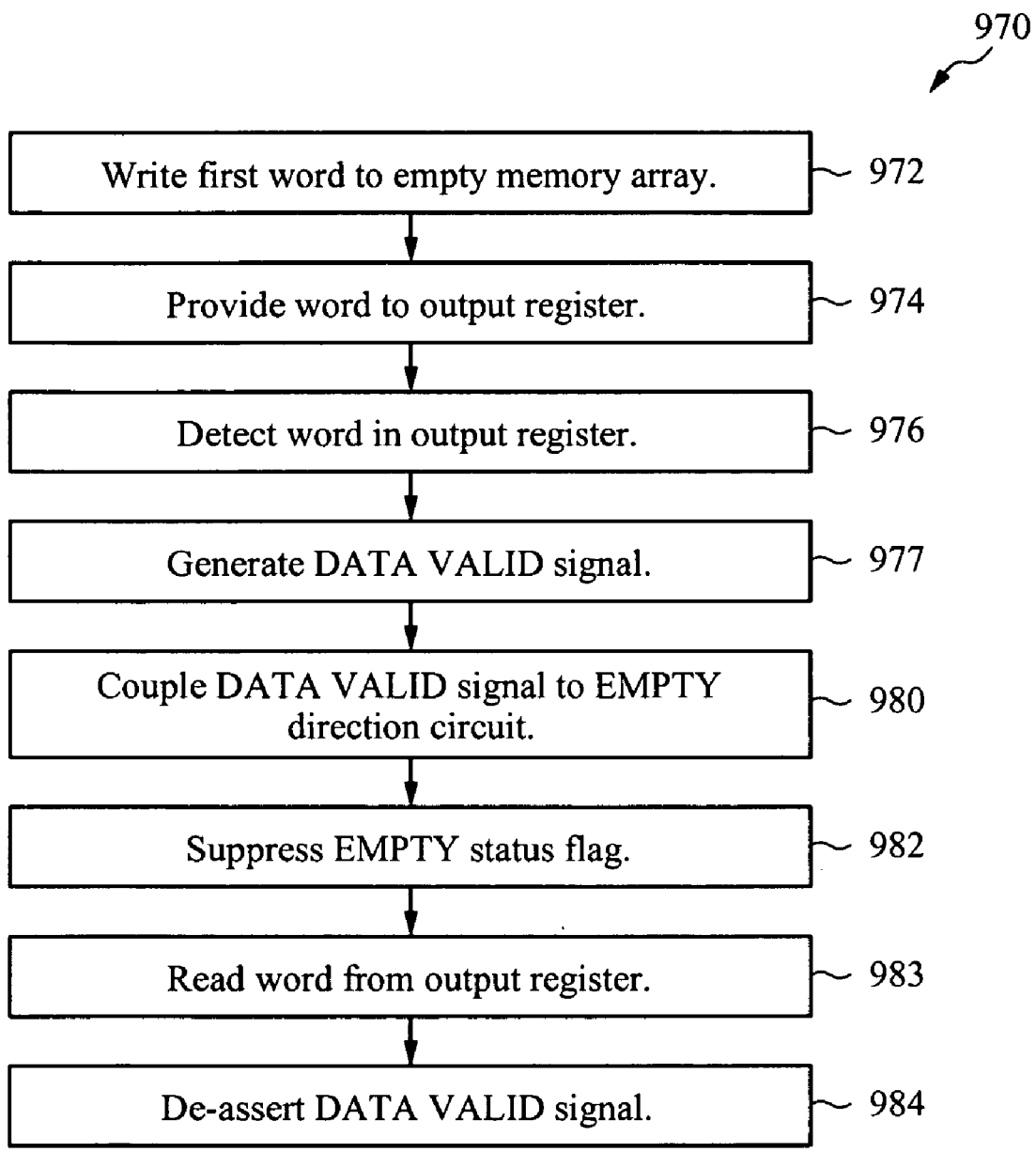
FIG. 9C is a simplified flow chart of a method of pre-fetching data in an embedded FIFO memory system.

FIG. 9C is a simplified flow chart of a method 970 of pre-fetching data in an embedded FIFO memory system. A first word is written to an empty FIFO memory array embedded in a programmable logic device (step 972) and provided to an output register of the FIFO memory system (step 974). The first word in the output register is detected (step 976), and a data valid signal is generated (step 977). In one embodiment, the first word is provided to an output of the output register, and is output before a read enable signal is asserted. In an alternative embodiment, the step of reading the first word occurs when a read enable signal is asserted.

In a further embodiment, the data valid signal is coupled to an EMPTY detection circuit of the embedded FIFO memory system (step 980) and an EMPTY status flag is suppressed (step 982) if the data valid signal is asserted, allowing the word to be read from the output register (or the output register output) (step 983), which de-asserts the data valid signal (step 984) if no new data has been written to the output register.

In another embodiment, after the first word has been read, a second word is written to the empty FIFO memory array and provided to the output register. This second word is detected and a second data valid signal is generated, thus allowing reading the second word from the output register. For example, if the read clock is faster than the write clock, multiple words may fall through to the output register and be read from the output register while the FIFO memory array remains empty.

Figure 9D:
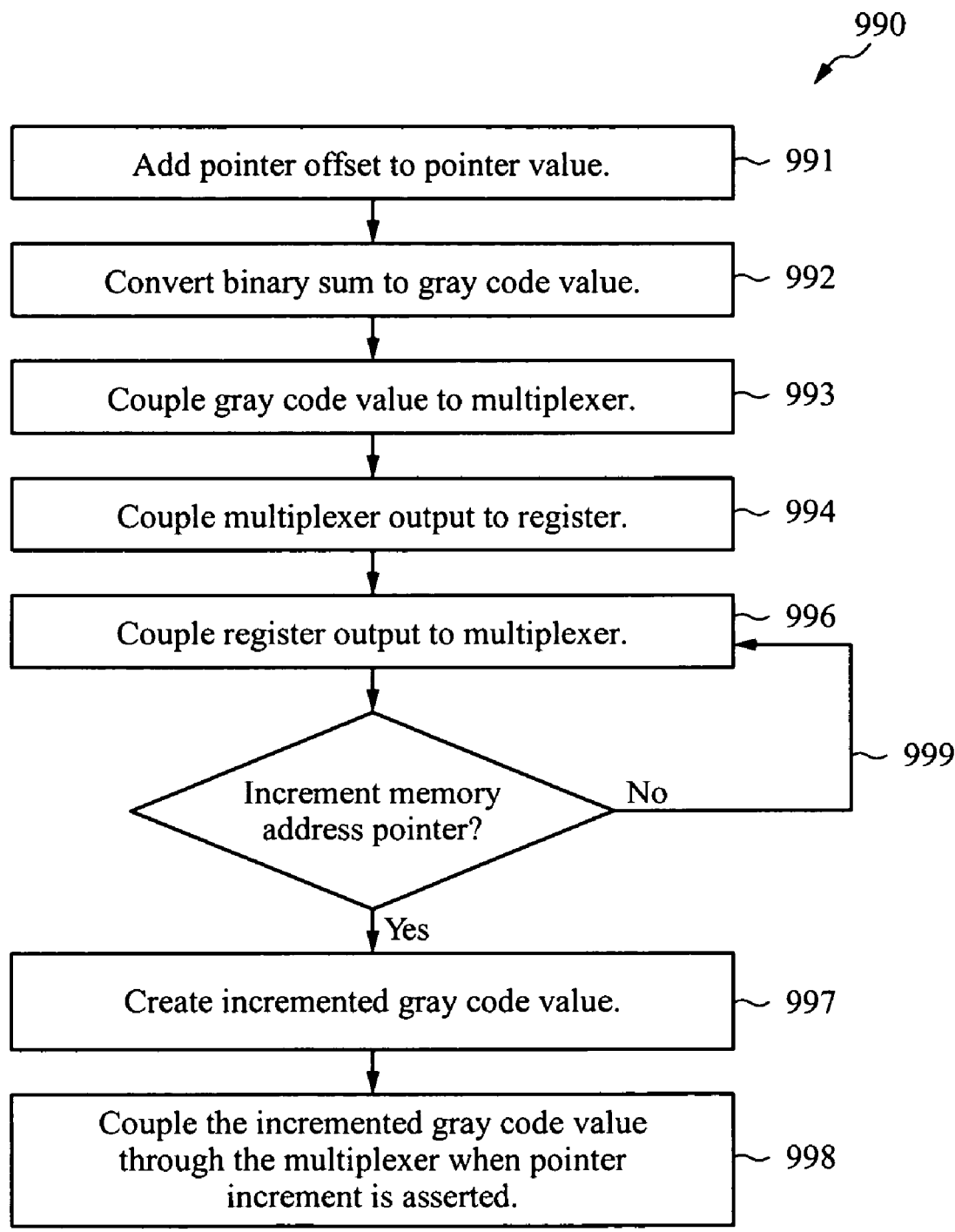
FIG. 9D is a simplified flow chart of a method for Gray-code counting in a programmable logic device.

FIG. 9D is a simplified flow chart of a method 990 for Gray-code counting in a programmable logic device. FIG. 8 illustrates an example of a circuit suitable for performing this method. A selected pointer offset binary value is added to a pointer count binary value to produce a binary sum (step 991). The binary sum is converted to a Gray-code value (step 992), and the Gray-code value is coupled to a first port of a multiplexer (step 993). The multiplexer output is coupled to a register input (step 994), and the register output is coupled (fed back) to a second port of the multiplexer (step 996). The pointer count binary value is incremented in response to a pointer increment signal to create an incremented Gray-code value (step 997), and the incremented Gray-code value is coupled through the multiplexer when the pointer increment signal is asserted (step 998), and the register output is coupled through the multiplexer when the pointer increment signal is not asserted (step 999).

In the foregoing specification, the invention has been described with reference to specific exemplary embodiments thereof. Other embodiments will be apparent to those of ordinary skill in the art. For example, specific embodiments have been discussed with reference to PLDs, such as FPGAs and CPLDs; however, embodiments of the invention can be implemented in other types of integrated circuits such as application specific integrated circuits (ASICs). Thus, it is evident that various modifications and changes may be made thereunto without departing from the broader spirit and scope of the invention as set forth in the appended claims and their full scope of equivalents.

What is claimed is:

1. A system for gray-code counting comprising:
    a binary counter coupled to a reset signal, a clock signal, and a pointer increment signal, and providing a binary output;
    an adder coupled to the binary output and to a selected binary offset value, the adder providing a binary sum output; and
    a binary-to-gray converter coupled to the binary sum output and providing a first gray code value representing the binary sum output.

2. The system of claim 1 further comprising:
    a multiplexer having
       a first input port,
       a second input port coupled to the first gray code value,
       a select port coupled to a select signal, and
       an output port; and
    a register coupled to the output port of the multiplexer, a register output being coupled to the first input port of the multiplexer to feed back a register value if the select signal is not asserted, and to couple the first gray code value to the output register if the select signal is asserted.

3. The system of claim 2 further comprising:
    an OR gate coupled to the reset signal and to the pointer increment signal and providing the select signal to the select port of the multiplexer if either the reset signal or the pointer increment signal is asserted.

4. The system of claim 1 wherein the binary-to-gray code converter is a 12-bit converter.

5. The system of claim 1 wherein the binary-to-gray code converter provides a first binary input and a shifted first binary input to an exclusive NOR gate.

6. A method for gray-code counting in a programmable logic device comprising steps of:
    adding a selected pointer offset binary value to a pointer count binary value to produce a binary sum;
    converting the binary sum to a gray-code value representing the binary sum;
    providing the gray-code value to a first port of a multiplexer;
    coupling a multiplexer output to a resister input;
    coupling a register output to a second port of the multiplexer; and
    incrementing the pointer count binary value in response to a pointer increment signal to create an incremented gray-code value, wherein the incremented gray-code value is selected to be coupled through the multiplexer when a multiplexer select signal is asserted.

7. The method of claim 6 further comprising:
    selecting the second port of the multiplexer to be coupled to the register when the a select signal is not asserted.

8. The method of claim 6 further comprising:
    coupling a multiplexer output to a register input;
    coupling a register output to a second port of the multiplexer; and
    selecting the second port of the multiplexer to be coupled to the register when the a select signal is not asserted.

9. A system for gray-code counting in an integrated circuit comprising:
    means for counting a pointer position;
    means for adding an offset value to the pointer position to produce a binary sum; and
    means for converting the binary sum to a gray code value;
    means for multiplexing one of the gray code value and an output of a register to an input of the register.

10. The system of claim 9 further comprising:
    means for providing a select signal to the means for multiplexing, the select signal being asserted according to a reset signal or to a pointer increment signal.

11. A programmable logic device having a system for gray-code counting comprising:

a binary counter coupled to a reset signal, a clock signal, and a pointer increment signal, and providing a binary output;

an adder coupled to the binary output and to a selected binary offset value, the adder providing a binary sum output; and a binary-to-gray converter coupled to the binary sum output and providing a first gray code value representing the binary sum output.

12. The programmable logic device of claim 11 further comprising:

a multiplexer in the programmable logic device, the multiplexer having a first input port, a second input port coupled to the first gray code value, a select port coupled to a select signal, and an output port; and a register coupled to the output port of the multiplexer, a register output being coupled to the first input port of the multiplexer to feed back a register value if the select signal is not asserted, and to couple the first gray code value to the output register if the select signal is asserted.

* * * * *